(12) United States Patent
Kim

(10) Patent No.: US 8,432,342 B2
(45) Date of Patent: Apr. 30, 2013

(54) PIXEL AND ORGANIC LIGHT EMITTING DISPLAY USING THE SAME

(75) Inventor: Hyung-Soo Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 174 days.

(21) Appl. No.: 13/118,149

(22) Filed: May 27, 2011

(65) Prior Publication Data

US 2012/0075363 A1    Mar. 29, 2012

(30) Foreign Application Priority Data

Sep. 29, 2010    (KR) .................. 10-2010-0094226

(51) Int. Cl.
*G09G 3/34*    (2006.01)

(52) U.S. Cl.
USPC ................ 345/84; 345/76; 345/212

(58) Field of Classification Search .............. 345/76–78, 345/204–215, 84–86; 257/88, E51.018
See application file for complete search history.

(56) References Cited

U.S. PATENT DOCUMENTS 7,615,932 B2 * 11/2009 Abe et al. .................. 315/169.3
8,237,634 B2 * 8/2012 Kwak .......................... 345/76
2007/0247932 A1 * 10/2007 Tobita ..................... 365/189.12

FOREIGN PATENT DOCUMENTS

| KR | 10-2002-0077007 A | 10/2002 |
| KR | 10-2005-0100888 A | 10/2005 |
| KR | 10-0698705 B1 | 3/2007 |

* cited by examiner

*Primary Examiner* — Kent Chang
*Assistant Examiner* — Gerald Oliver
(74) *Attorney, Agent, or Firm* — Christie, Parker & Hale, LLP

(57) ABSTRACT

A pixel of an organic light emitting display in which the pixel includes: a first transistor including a first electrode coupled to a first power source, a second electrode, and a gate electrode coupled to a first node; a second transistor including a first electrode coupled to a third power source, a second electrode coupled to the first node, and a gate electrode coupled to a reset control line; a third transistor including a first electrode coupled to the first node, a second electrode coupled to a fourth power source, and a gate electrode; a fourth transistor including a first electrode coupled to the gate electrode of the third transistor, a second electrode coupled to a scan line, and a gate electrode coupled to a data line; and an organic light emitting diode (OLED) including an anode electrode coupled to the second electrode of the first transistor, and a cathode electrode coupled to a second power source.

8 Claims, 6 Drawing Sheets

(12) United States Patent
US 8,432,342 B2

PIXEL AND ORGANIC LIGHT EMITTING DISPLAY USING THE SAME

CROSS-REFERENCE TO RELATED APPLICATION

This application claims priority to and the benefit of Korean Patent Application No. 10-2010-0094226, filed on Sep. 29, 2010, in the Korean Intellectual Property Office, the entire content of which is incorporated herein by reference.

BACKGROUND

1. Field

The present invention relates to a pixel and an organic light emitting display using the same.

2. Description of Related Art

Recently, various flat panel displays (FPDs) capable of reducing weight and volume that are disadvantages of cathode ray tubes (CRTs) have been developed. FPDs include liquid crystal displays (LCDs), field emission displays (FEDs), plasma display panels (PDPs), and organic light emitting displays.

Among the FPDs, organic light emitting displays display an image using organic light emitting diodes (OLEDs) that generate light by recombination of electrons and holes. Organic light emitting displays have high response speed and are driven with low power consumption.

However, since the pixels of conventional organic light emitting displays display gray scales (e.g., gray levels) using the voltage stored in a storage capacitor, it may be difficult to correctly display desired gray levels (e.g., in analog driving). Since a plurality of gray levels are to be displayed using a uniform voltage that may be stored in the storage capacitor, it may be difficult to correctly display a difference in brightness between adjacent gray levels.

In addition, when the storage capacitor is used for each of the pixels, for charge/discharge operations of the storage capacitor, time (e.g., predetermined time) is spent so that driving speed is reduced. Furthermore, when the storage capacitor is used for each of the pixels, high power consumption occurs as a result of the charge/discharge of the storage capacitor.

SUMMARY

Accordingly, embodiments of the present invention provide a pixel capable of reducing power consumed during driving, and capable of performing high speed driving, and an organic light emitting display using the same.

In order to achieve the foregoing and/or other aspects of embodiments of the present invention, there is provided a pixel including: a first transistor including a first electrode coupled to a first power source, a second electrode, and a gate electrode coupled to a first node; a second transistor including a first electrode coupled to a third power source, a second electrode coupled to the first node, and a gate electrode coupled to a reset control line; a third transistor including a first electrode coupled to the first node, a second electrode coupled to a fourth power source, and a gate electrode; a fourth transistor including a first electrode coupled to the gate electrode of the third transistor, a second electrode coupled to a scan line, and a gate electrode coupled to a data line; and an organic light emitting diode (OLED) including an anode electrode coupled to the second electrode of the first transistor, and a cathode electrode coupled to a second power source.

A voltage of the third power source may be substantially the same as a voltage of the first power source.

A voltage of the fourth power source may be substantially the same as a voltage of the second power source.

The transistors may be PMOS transistors or NMOS transistors.

According to another embodiment of the present invention, there is provided an organic light emitting display including a scan line driver for sequentially supplying scan signals to scan lines in scan periods in a plurality of sub frames of one frame, a control line driver for sequentially supplying reset signals to reset control lines in reset periods in the sub frames, a data driver for supplying data signals to data lines in the scan periods, and a display unit including pixels configured to emit light in emission periods in the sub frames, and configured to be transitioned into a non-emission state to not emit light in a reset period of the reset periods, wherein each of the pixels includes: a first transistor including a first electrode coupled to a first power source, a second electrode, and a gate electrode coupled to a first node; a second transistor including a first electrode coupled to a third power source, a second electrode coupled to the first node, and a gate electrode coupled to a reset control line of the reset control lines; a third transistor including a first electrode coupled to the first node, a second electrode coupled to a fourth power source, and a gate electrode; a fourth transistor including a first electrode coupled to the gate electrode of the third transistor, a second electrode coupled to a scan line of the scan lines, and a gate electrode coupled to a data line of the data lines; and an OLED including an anode electrode coupled to the second electrode of the first transistor, and a cathode electrode coupled to a second power source.

A voltage of the third power source may be substantially the same as a voltage of the first power source.

A voltage of the fourth power source may be substantially the same as a voltage of the second power source.

The transistors may be PMOS transistors or NMOS transistors.

As described above, according to embodiments of the present invention, the pixel capable of reducing power consumed during driving, and capable of performing high speed driving, and the organic light emitting display using the same may be provided.

BRIEF DESCRIPTION OF THE DRAWINGS

The accompanying drawings, together with the specification, illustrate exemplary embodiments of the present invention, and, together with the description, serve to explain principles and aspects of embodiments of the present invention.

DETAILED DESCRIPTION

Figure 1:
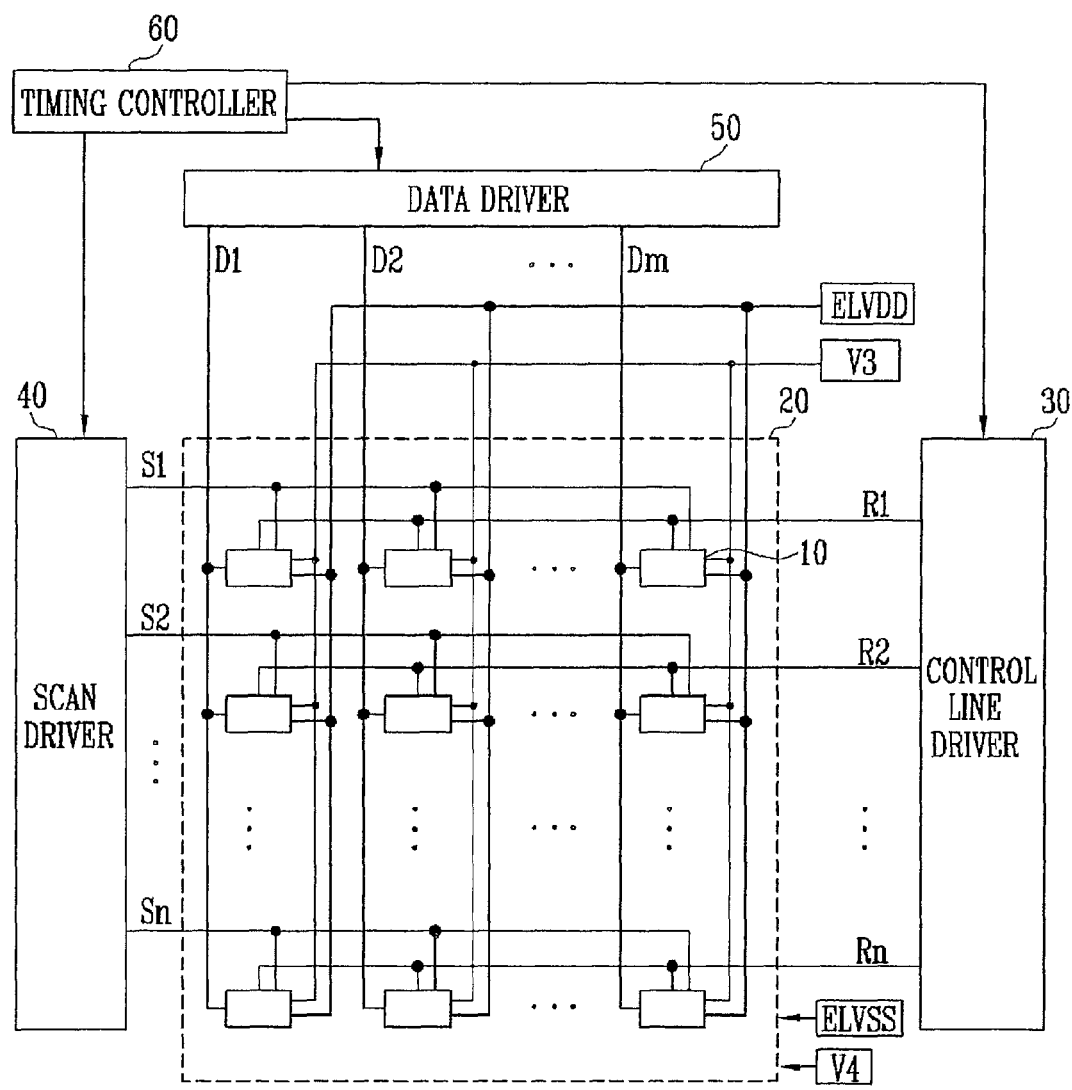
FIG. 1 is a view illustrating an organic light emitting display according to a first embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more other elements. Further, some of the elements that are not essential to a complete understanding of the invention are omitted for clarity. Also, like reference numerals refer to like elements throughout.

Specific items of the other embodiments are included in the detailed description and drawings.

The aspects of embodiments of the present invention, and a method of achieving the aspects of embodiments of the present invention, will be clarified with reference to the embodiments described hereinafter in detail together with the accompanying drawings. However, the present invention is not limited to the embodiments disclosed hereinafter, but may be realized in different forms without departing from the spirit and scope of the present invention.

FIG. 1 is a view illustrating an organic light emitting display according to a first embodiment of the present invention.

Referring to FIG. 1, the organic light emitting display according to the first embodiment of the present invention includes a display unit 20 including: a plurality of pixels 10 coupled to scan lines S1 to Sn, reset control lines R1 to Rn, data lines D1 to Dm, a first power source ELVDD, a second power source ELVSS, a third power source V3, and a fourth power source V4; a control line driver 30 for supplying reset signals to the pixels 10 through the reset control lines R1 to Rn; a scan driver 40 for supplying scan signals to the pixels 10 through the scan lines S1 to Sn; and a data driver 50 for supplying data signals to the pixels 10 through the data lines D1 to Dm. The organic light emitting display may further include a timing controller 60 for controlling the control line driver 30, the scan driver 40, and the data driver 50.

The data driver 20 supplies the data signals to the data lines D1 to Dm in each of a plurality of sub frames included in one frame. Here, the data signals are divided into first data signals by which the pixels 10 may emit light, and second data signals by which the pixels 10 do not emit light.

The data driver 20 supplies the first data signals or the second data signals for controlling whether the pixels 10 emit light to the data lines D1 to Dm in each of the sub frames.

The scan driver 10 sequentially supplies the scan signals to the scan lines S1 to Sn in each of the sub frames. When the scan signals are sequentially supplied to the scan lines S1 to Sn, the pixels 10 are sequentially selected by lines (e.g., line by line), and the selected pixels 10 receive the first data signals or the second data signals supplied from the data lines D1 to Dm.

The control line driver 30 sequentially supplies the reset signals to the reset control lines R1 to Rn after the pixels 10 emit light for an amount of time (e.g., a predetermined time) in the sub frames.

The pixels 10 that receive the reset signals are in or transitioned into a non-emission state regardless of a previous state.

The display unit 20 receives power from the first power source ELVDD, the second power source ELVSS, the third power source V3, and the fourth power source V4 from the outside (e.g., from sources external to the display unit 20) to supply power from the first power source ELVDD, the second power source ELVSS, the third power source V3, and the fourth power source V4 to the pixels 10.

The pixels 10 that receive power from the first power source ELVDD, the second power source ELVSS, the third power source V3, and the fourth power source V4 receive the data signals (the first data signals or the second data signals) when the scan signals are supplied, and emit light or do not emit light in the sub frames in accordance with the received data signals. The pixels 10 are transitioned into a non-emission state using a voltage of the third power source V3 when the reset signals are supplied.

Figure 2:
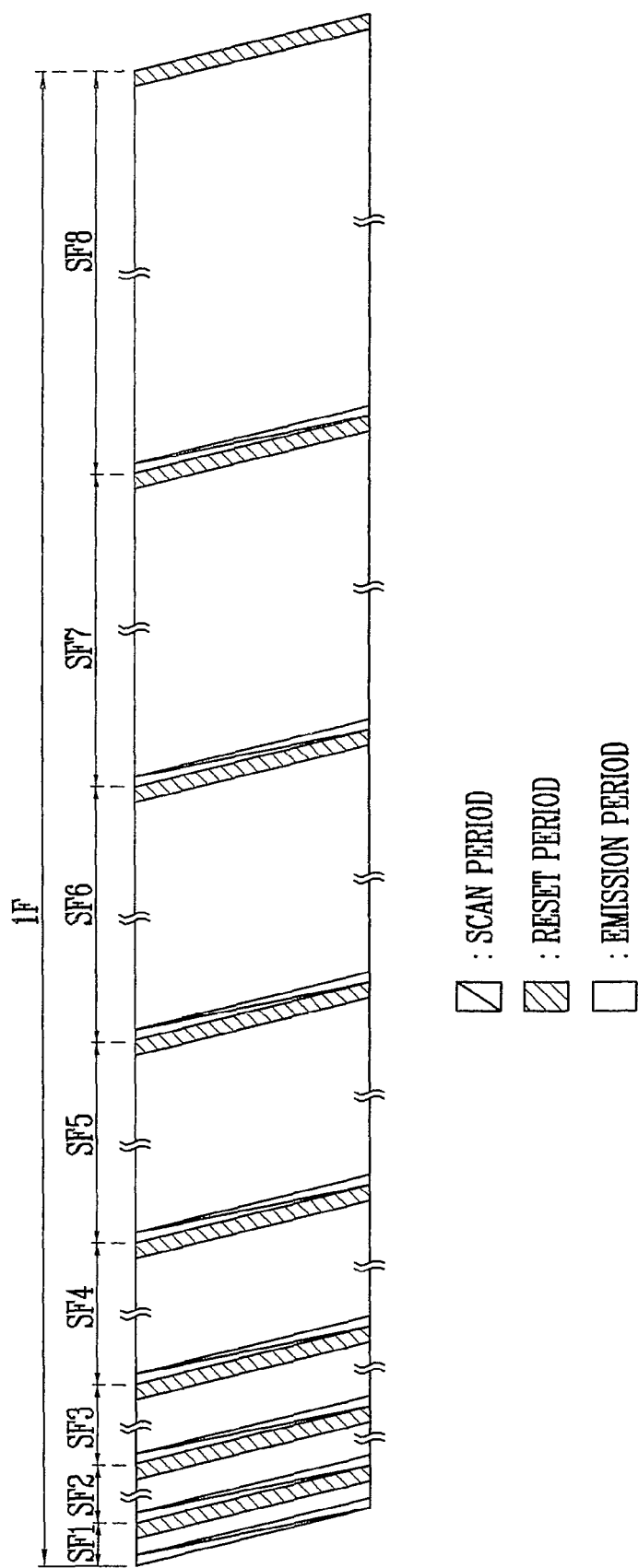
FIG. 2 is a view illustrating one frame according to an embodiment of the present invention.
Figure 3:
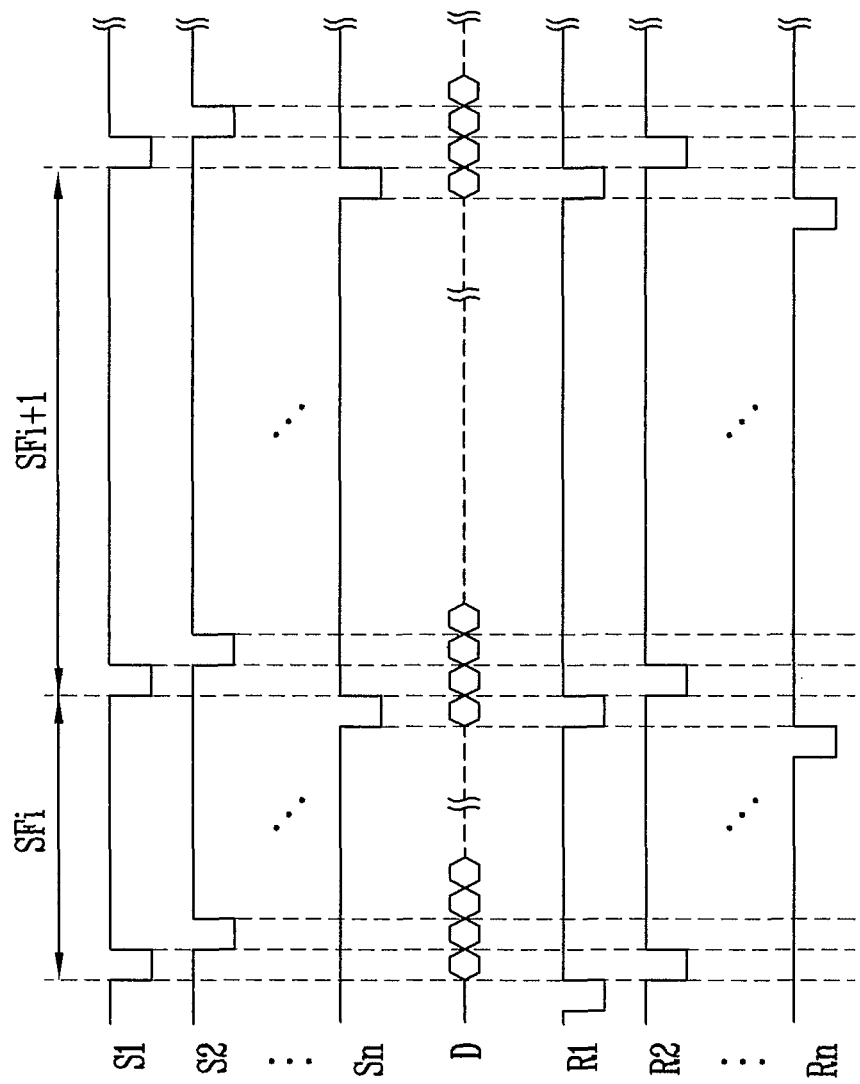
FIG. 3 is a view illustrating driving waveforms supplied in a sub frame period included in one frame according to an embodiment of the present invention.

FIG. 2 is a view illustrating one frame according to an embodiment of the present invention. FIG. 3 is a view illustrating driving waveforms supplied in a sub frame period included in one frame.

Referring to FIGS. 2 and 3, one frame 1F of the described embodiment of the present invention is divided into a plurality of sub frames SF1 to SF8 to be driven (e.g., digital driving).

The sub frames SF1 to SF8 are divided into a scan period for sequentially supplying the scan signals, an emission period in which the pixels 10 that receive the first data signals in the scan period emit light, and a reset period in which the pixels 10 are transitioned into the non-emission state to be driven.

In the scan period, the scan signals are sequentially supplied to the scan lines S1 to Sn, and the first data signals or the second data signals are supplied to the data lines D1 to Dm. That is, in the scan period, the pixels 10 receive the first data signals or the second data signals.

In the emission period, the pixels 10 maintain the first data signals and the second data signals supplied in the scan period to emit light or to not emit light. That is, the pixels 10 that receive the first data signals in the scan period are set in the emission state in the corresponding sub frame period, and the pixels 10 that receive the second data signals are set in the non-emission state in the corresponding sub frame period.

Here, for example, the emission periods of the sub frames SF1 to SF8 are set to vary. For example, when an image is to be displayed by 256 gray levels, as illustrated in FIG. 2, one frame is divided into eight sub frames SF1 to SF8. The emission periods of the eight sub frames SF1 to SF8 increase in the ratio of $2^n$ (n=0, 1, 2, 3, 4, 5, 6, and 7).

That is, according to embodiments of the present invention, whether the pixels 10 emit light is controlled in the sub frames (e.g., SF1 to SF8) to display an image of a gray level (e.g., a predetermined gray level). That is, according to embodiments of the present invention, a gray level (e.g., a predetermined gray level) is displayed in one frame 1F period corresponding to the sum of times for which the pixels 10 emit light in the sub frame periods.

One frame 1F illustrated in FIG. 2 is an example for displaying according to embodiments of the present invention, and the present invention is not limited to the above. For example, one frame 1F may be divided into 10 sub frames or more, and the emission periods of the sub frames may be varied.

In the reset period, the reset signals are sequentially supplied to the reset control lines R1 to Rn. Actually, the reset signals are supplied to the pixels 10 after the pixels 10 emit light for an amount of time (e.g., a predetermined time) in the sub frames (e.g., SF1 to SF8). For example, the reset signal supplied to the $i^{th}$ (i is a natural number) reset control line Ri may be supplied immediately before a scan signal supplied to the $i^{th}$ scan line Si, as illustrated in FIG. 3. When the reset signals are sequentially supplied to the reset control lines R1 to Rn in the reset period, the pixels 10 are sequentially transitioned into the non-emission state.

Figure 4:
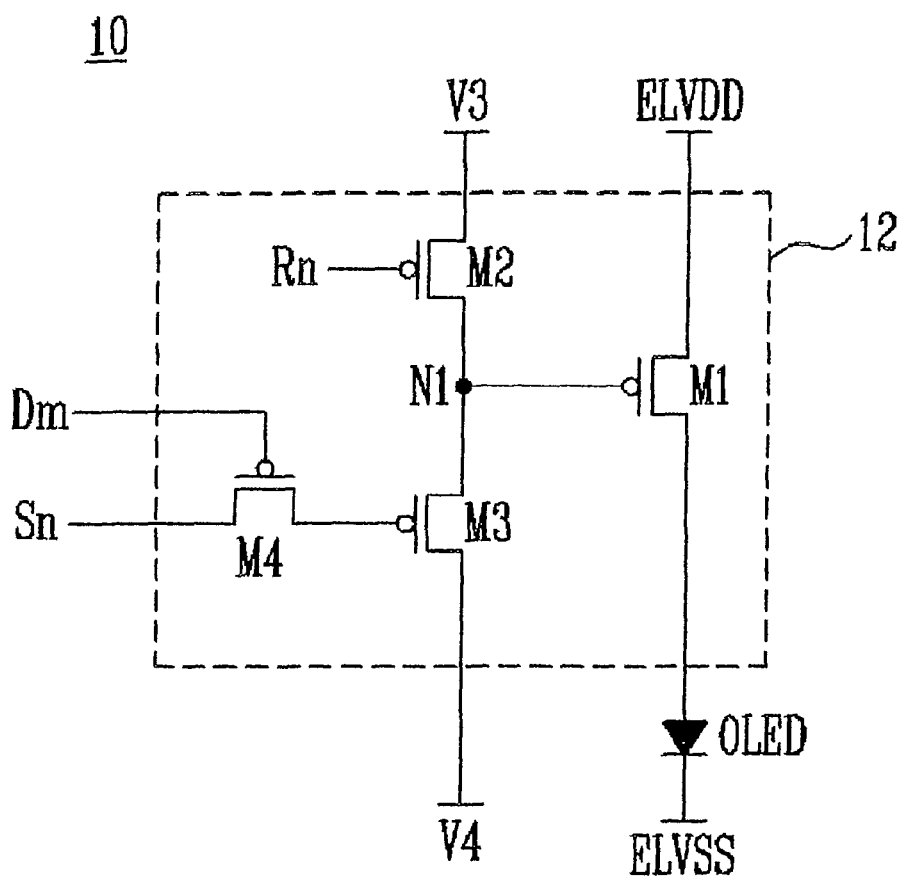
FIG. 4 is a view illustrating a pixel according to the first embodiment of the present invention.

FIG. 4 is a view illustrating a pixel according to the first embodiment of the present invention. In FIG. 4, for convenience's sake, the pixel 10 coupled to the $n^{th}$ scan line Sn and the $m^{th}$ data line Dm will be illustrated.

Referring to FIG. 4, the pixel 10 according to the first embodiment of the present invention includes a pixel circuit 12 coupled to an organic light emitting diode OLED, the data line Dm, the reset control line Rn, and the scan line Sn, to control the OLED.

An anode electrode of the OLED is coupled to the pixel circuit 12 and a cathode electrode of the OLED is coupled to the second power source ELVSS. Whether the OLED emits light is controlled in accordance with a data signal supplied to the pixel circuit 12.

The pixel circuit 12 controls whether the OLED emits light according to the data signal supplied to the data line Dm when a scan signal is supplied to the scan line Sn. The pixel circuit 12 receives power from the third power source V3 when a reset signal is supplied to the reset control line Rn to transit the OLED into the non-emission state.

Therefore, the pixel circuit 12 includes first to fourth transistors M1, M2, M3, and M4.

A first electrode of the first transistor M1 is coupled to the first power source ELVDD, a second electrode of the first transistor M1 is coupled to the anode electrode of the OLED, and a gate electrode of the first transistor M1 is coupled to a first node N1. The first transistor M1 is turned on or turned off according to the voltage value applied to the first node N1 to control the emission or non-emission of the OLED.

A first electrode of the second transistor M2 is coupled to the third power source V3, a second electrode of the second transistor M2 is coupled to the first node, and a gate electrode of the second transistor M2 is coupled to the reset control line Rn. The second transistor M2 is turned on when the reset signal is supplied to the reset control line Rn to apply power from the third power source V3 to the first node N1.

The reset signal for turning on the second transistor M2 has a low level voltage when the second transistor M2 is a PMOS transistor, as illustrated in FIG. 4, and has a high level voltage when the second transistor M2 is an NMOS transistor.

A first electrode of the third transistor M3 is coupled to the first node N1, a second electrode of the third transistor M3 is coupled to the fourth power source V4, and a gate electrode of the third transistor M3 is coupled to a first electrode of the fourth transistor M4. The third transistor M3 is turned on to apply power from the fourth power source V4 to the first node N1 when a scan signal transmitted by the fourth transistor M4 is supplied to the gate electrode of the third transistor M3.

The first electrode of the fourth transistor M4 is coupled to the gate electrode of the third transistor M3, a second electrode of the fourth transistor M4 is coupled to the scan line Sn, and a gate electrode of the fourth transistor M4 is coupled to the data line Dm.

The fourth transistor M4 is turned on to apply the scan signal supplied to the scan line Sn to the gate electrode of the third transistor M3 when the first data signals are supplied from the data line Dm. When the second data signals are supplied from the data line Dm, the fourth transistor M4 is turned off to block the transmission of the scan signal.

The first data signals for turning on the fourth transistor M4 have low level voltages when the fourth transistor M4 is a PMOS transistor, as illustrated in FIG. 4, and have high level voltages when the fourth transistor M4 is an NMOS transistor.

The second data signals for turning off the fourth transistor M4 have high level voltages when the fourth transistor M4 is a PMOS transistor, as illustrated in FIG. 4, and have low level voltages when the fourth transistor M4 is an NMOS transistor.

The first power source ELVDD as a high potential power source is coupled to the first electrode of the first transistor M1.

The second power source ELVSS as a low potential power source (for example, Ground) (e.g., a potential power source that is lower than the first power source ELVDD) is coupled to the cathode electrode of the OLED.

The third power source V3 as a high potential power source is applied to the first node N1 when a reset signal is supplied (e.g., to the gate electrode of the second transistor M2) to turn off the first transistor M1. The voltage of the third power source V3 may be set to be the same as a voltage of the first power source ELVDD.

The fourth power source V4 as a low potential power source is applied to the first node N1 to turn on the first transistor M1 when the scan signal is supplied to turn on the third transistor M3 (e.g., the scan signal is supplied via the fourth transistor M4 to the gate electrode of the third transistor M3). A voltage of the fourth power source V4 may be set to be the same as a voltage of the second power source ELVSS.

The first node N1 is a contact point at which the gate electrode of the first transistor M1, the second electrode of the second transistor M2, and the first electrode of the third transistor M3 are coupled.

When an operation process of the pixel 10 according to the first embodiment is described in detail, the scan signal and the data signal are supplied to the pixels 10 in the scan period.

The data driver 50 supplies the first data signals for the pixels 10 that emit light, and supplies the second data signals to the pixels 10 that do not emit light. This is because, unlike the conventional pixel structure, according to embodiments of the present invention, the data signal is applied to the gate electrode of the fourth transistor M4.

When the first data signals are supplied to the data line Dm, the fourth transistor M4 is turned on to apply the scan signal to the gate electrode of the third transistor M3. Therefore, the third transistor M3 is turned on by the scan signal so that power from the fourth power source V4 is applied to the first node N1.

When power from the fourth power source V4 is applied to the first node N1, since the fourth power source V4 is a low level voltage, the first transistor M1 is turned on. When the first transistor M1 is turned on, current corresponding to the first power source ELVDD is supplied to the OLED. Then, the OLED emits light in the corresponding sub frame period.

When the second data signals are supplied to the data line Dm, the fourth transistor M4 is turned off to block the transmission of the scan signal to the gate electrode of the third transistor M3. Therefore, the third transistor M3 is not turned on so that power from the fourth power source V4 is not applied to the first node N1.

As a result, the first transistor M1 is not turned on, and the OLED maintains the non-emission state in the corresponding sub frame period.

The pixels 10 that receive the first data signals emit light, and a reset period exists after the emission period in which the pixels 10 that receive the second data signals do not emit light.

In the reset period, the reset signal is supplied to the reset control line Rn, and the second transistor M2 is turned on by the supply of the reset signal. As the second transistor M2 is turned on, power from the third power source V3 is applied to the first node N1.

Since power from the third power source V3 is a high level voltage, the first transistor M1 is turned off, and the OLED that emits light is transitioned into the non-emission state.

As described above, according to embodiments of the present invention, one frame (e.g., 1F) is divided into a plurality of sub frames (e.g., SF1 to SF8), and whether or not the pixels 10 emit light is controlled in the sub frame period to display gray levels. As described above, when the gray levels are displayed corresponding to whether the pixels 10 emit light, a desired gray level may be correctly displayed.

In addition, when a voltage is applied to the gate electrode of the first transistor M1, since the gate overlap capacitance of the first transistor M1 and the parasitic capacitance of the second transistor M2 and the third transistor M3 exist, an additional storage capacitor is not necessary.

Since the voltage required for (e.g., applied to) the gate electrode of the first transistor M1 is supplied from the third power source V3 and the fourth power source V4 in a pixel 10, power consumption is reduced, and driving speed also increases.

Figure 5:
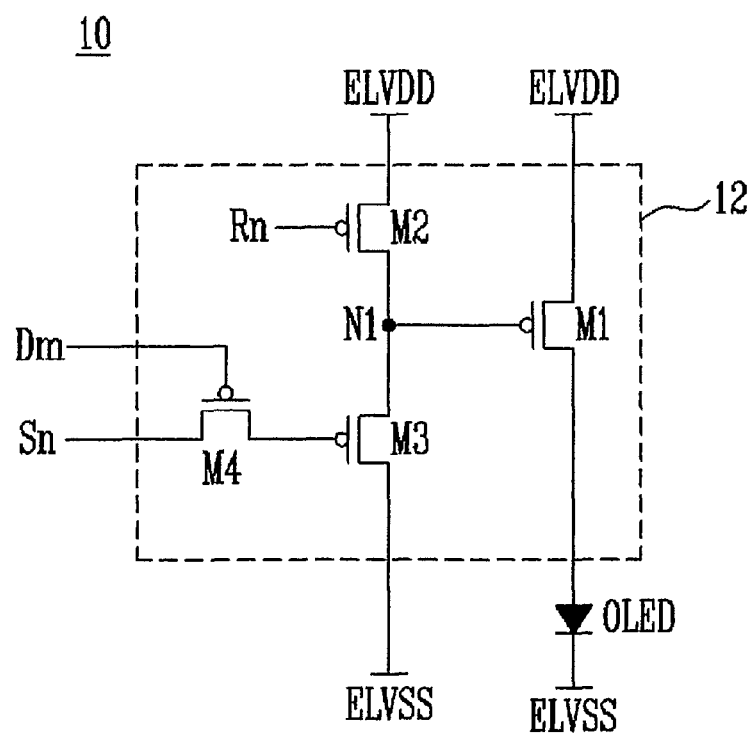
FIG. 5 is a view illustrating a pixel according to a second embodiment of the present invention.

FIG. 5 is a view illustrating a pixel according to a second embodiment of the present invention.

Referring to FIG. 5, the third power source V3 of the first embodiment is changed to the first power source ELVDD in the second embodiment, and the fourth power source V4 of the first embodiment is changed to the second power source ELVSS in the second embodiment.

That is, the third power source V3 may be the same as the first power source ELVDD, and the fourth power source V4 may be the same as the second power source ELVSS.

When the above-described changes are made, the above-described operation may be performed, and it is not necessary to include additional third and fourth power sources V3 and V4.

Figure 6:
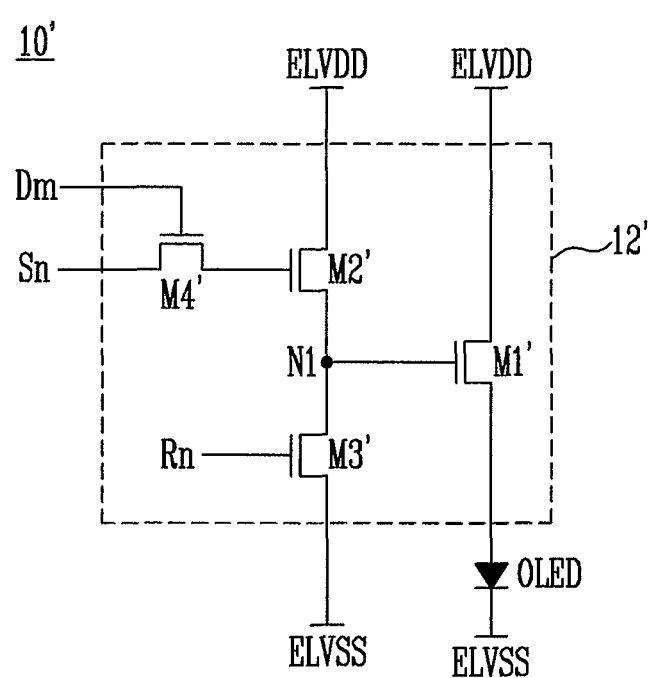
FIG. 6 is a view illustrating a pixel according to a third embodiment of the present invention.

FIG. 6 is a view illustrating a pixel according to a third embodiment of the present invention. In FIG. 5, the pixel 10 in which the first to fourth transistors M1 to M4 are PMOS transistors is illustrated. However, in FIG. 6, a pixel 10' in which the first to fourth transistors M1, M2', M3', and M4' are NMOS transistors is illustrated.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A pixel of an organic light emitting display, the pixel comprising:
 a first transistor comprising:
  a first electrode coupled to a first power source;
  a second electrode; and
  a gate electrode coupled to a first node;
 a second transistor comprising:
  a first electrode coupled to a third power source;
  a second electrode coupled to the first node; and
  a gate electrode coupled to a reset control line;
 a third transistor comprising:
  a first electrode coupled to the first node;
  a second electrode coupled to a fourth power source; and
  a gate electrode;
 a fourth transistor comprising:
  a first electrode coupled to the gate electrode of the third transistor;
  a second electrode coupled to a scan line; and
  a gate electrode coupled to a data line; and
 an organic light emitting diode (OLED) comprising:
  an anode electrode coupled to the second electrode of the first transistor; and
  a cathode electrode coupled to a second power source.

2. The pixel as claimed in claim 1, wherein a voltage of the third power source is substantially the same as a voltage of the first power source.

3. The pixel as claimed in claim 2, wherein a voltage of the fourth power source is substantially the same as a voltage of the second power source.

4. The pixel as claimed in claim 1, wherein the transistors are PMOS transistors or NMOS transistors.

5. An organic light emitting display comprising:
 a scan line driver for sequentially supplying scan signals to scan lines in scan periods in a plurality of sub frames of one frame;
 a control line driver for sequentially supplying reset signals to reset control lines in reset periods in the sub frames;
 a data driver for supplying data signals to data lines in the scan periods; and
 a display unit comprising pixels configured to emit light in emission periods in the sub frames, and configured to be transitioned into a non-emission state to not emit light in a reset period of the reset periods,
 wherein each of the pixels comprises:
  a first transistor comprising:
   a first electrode coupled to a first power source;
   a second electrode; and
   a gate electrode coupled to a first node;
  a second transistor comprising:
   a first electrode coupled to a third power source;
   a second electrode coupled to the first node; and
   a gate electrode coupled to a reset control line of the reset control lines;
  a third transistor comprising:
   a first electrode coupled to the first node;
   a second electrode coupled to a fourth power source; and
   a gate electrode;
  a fourth transistor comprising:
   a first electrode coupled to the gate electrode of the third transistor;
   a second electrode coupled to a scan line of the scan lines; and
   a gate electrode coupled to a data line of the data lines; and
  an OLED comprising:
   an anode electrode coupled to the second electrode of the first transistor; and
   a cathode electrode coupled to a second power source.

6. The organic light emitting display as claimed in claim 5, wherein a voltage of the third power source is substantially the same as a voltage of the first power source.

7. The organic light emitting display as claimed in claim 6, wherein a voltage of the fourth power source is substantially the same as a voltage of the second power source.

8. The organic light emitting display as claimed in claim 5, wherein the transistors are PMOS transistors or NMOS transistors.

* * * * *